United States Patent
Takai et al.

(10) Patent No.: US 8,093,762 B2
(45) Date of Patent: Jan. 10, 2012

(54) SEMICONDUCTOR INTEGRATED CIRCUIT DEVICE

(75) Inventors: Kazuyoshi Takai, Tokyo (JP); Takahiro Yashita, Tokyo (JP); Kikuo Kato, Tokyo (JP); Kazuaki Kubo, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/178,933

(22) Filed: Jul. 8, 2011

(65) Prior Publication Data

US 2011/0260776 A1    Oct. 27, 2011

Related U.S. Application Data (63) Continuation of application No. 12/306,500, filed as application No. PCT/JP2006/313126 on Jun. 30, 2006, now Pat. No. 7,989,988.

(51) Int. Cl.
- *H02B 1/24* (2006.01)
- *H01H 31/10* (2006.01)
- *H01H 33/59* (2006.01)
- *H01H 47/00* (2006.01)
- *H01H 85/46* (2006.01)
- *H01H 19/14* (2006.01)

(52) U.S. Cl. ....................................................... 307/115

(58) Field of Classification Search .................. 307/10.1, 307/44, 66, 115; 180/282
See application file for complete search history.

(56) References Cited

U.S. PATENT DOCUMENTS

| | | | |
|---|---|---|---|
| 4,807,104 A | 2/1989 | Floyd et al. | |
| 5,805,058 A | 9/1998 | Saito et al. | |

FOREIGN PATENT DOCUMENTS

| | | | |
|---|---|---|---|
| JP | 52-80423 A | 7/1977 |
| JP | 2004-140756 A | 5/2004 |
| JP | 2005-051978 A | 2/2005 |
| JP | 2005-176131 A | 6/2005 |
| WO | WO 2004/047295 A1 | 6/2004 |

OTHER PUBLICATIONS

Safe-by-Wire Plus, Automotive Safety Restraints Bus ("ASRB"), 2.0 Specification Promoters Agreement, 2004.
ISO/IEC DIS 22896, Road vehicles—Deployment and sensor bus for passenger safety systems, 2005.

*Primary Examiner* — Jared Fureman
*Assistant Examiner* — Carlos Amaya
(74) *Attorney, Agent, or Firm* — Miles & Stockbridge P.C.

(57) ABSTRACT

In a power phase period when in normal operation, switch portions SW2H and SW2L and switch portions SW3H and SW3L are turned ON, respectively, and switch portions SW1H and SW1L are turned OFF. And floating power supply is provided from an electrostatic capacitance element CS to buses A and B, a floating control circuit 4, a transmitter circuit 5, and a receiver circuit 6, respectively. In a data phase period, the switch portions SW1H and SW1L are turned ON, and the switch portions SW2H, SW2L, SW3H, and SW3L are turned OFF. By that manner, the electrostatic capacitance element CS is charged by the power supply of a battery B, and an electrostatic capacitance element CH provides the floating power supply to the floating control circuit 4, the transmitter circuit 5, and the receiver circuit 6, respectively. By this manner, a floating switch unit 7 in which the number of the switch portions is considerably reduced can be configured.

21 Claims, 10 Drawing Sheets

FIG. 10 ically, the current value is different depending on...

SEMICONDUCTOR INTEGRATED CIRCUIT DEVICE

CROSS-REFERENCE TO RELATED APPLICATION

This application is a continuation of application Ser. No. 12/306,500 filed Dec. 23, 2008, now U.S. Pat. No. 7,989,988 which is a 371 of International Patent Application No. PCT/JP2006/313126 filed Jun. 30, 2006.

TECHNICAL FIELD

The present invention relates to a technique for providing a power supply by a switching circuit, and particularly to a technique effectively applied to provide a power supply of a floating power supply by a switching circuit.

BACKGROUND ART

As an object of establishing a LAN (Local Area Network) of an airbag system in an automobile, LAN protocols established by Safe-by-Wire Plus consortium and ISO (International Organization for Standardization)/IEC (International Electrotechnical Commission) are known (see Non-Patent Document 1 and Non-Patent Document 2).

The above-described standards define common specifications for an airbag control unit, a communication protocol between controllers which controls a peripheral device such as an airbag and a seatbelt, and a driver unit which drives a bus, and the requisite minimum specifications are determined.

And, the airbag control unit serving as a controller which controls the bus is called a "master", and a side of controlling the peripheral device such as an airbag and a seatbelt is called a "slave". The bus connects two lines of the master and the slave and becomes a path for providing the power supply and an operation of a bidirectional communication from a bus interface of the master side to a bus interface of the slave.

In the airbag control unit, a floating switch unit is used in the bus interface so that communication can be continued even when one side of the buses is short-circuited to a battery (power supply voltage) or a ground potential (reference potential).

For example, when the bus A is short-circuited to the battery, the voltage level of the bus B is shifted to the battery voltage side, and when the bus B is short-circuited to the ground potential, the voltage level of the bus A is shifted to the ground potential side, whereby the configuration is operated so that a voltage differential between the buses (the bus A−the bus B) is always maintained.

And, the floating switch unit comprises, for example, a switch which charges a first electrostatic capacitance from a battery power supply, a switch which provides the power supply from the first electrostatic capacitance to a transmitter circuit and the like, a switch which provides the power supply from the first electrostatic capacitance to the bus, a switch which charges a second electrostatic capacitance from the battery power supply, a switch which provides the power supply from the second electrostatic capacitance to a bus driver, and others.

Non-Patent Document 1: Automotive Safety Restraints BUS (ASRB) 2.0
Non-Patent Document 2: ISO/IEC 22896: Road Vehicles-Deployment and sensor bus for passenger safety systems

DISCLOSURE OF THE INVENTION

Problems to be Solved by the Invention

However, in the switching technique by the floating switch unit in the airbag control unit described above, the present inventors have found the following problems.

That is, since the above-described floating switch unit is required a MOS (Metal Oxide Semiconductor) transistor with high breakdown voltage, an element area of the transistor configuring the switch is comparatively large.

By this manner, downsizing of a semiconductor integrated circuit device configuring the airbag control unit is difficult, therefore there is also a problem that the manufacturing cost is high.

And, the required current value is different depending on the number or the type of the slave connected to the bus. However, the current has to be increased in order to enable a plurality of connection, therefore, it can be easily expected that the chip area occupied by a transistor element is further increased in order to decrease the ON-resistance of the switch.

An object of the present invention is to provide a technique which considerably reduces the number of switches in a switching circuit which provides a floating power supply and achieves downsizing and low-cost of a semiconductor integrated circuit device.

The above and other objects and novel characteristics of the present invention will be apparent from the description of this specification and the accompanying drawings.

Means for Solving the Problems

The typical ones of the inventions disclosed in this application will be briefly described as follows.

The present invention includes a semiconductor integrated circuit device having two externally-connected buses and a switching circuit providing the power supply voltage to an arbitrary internal peripheral circuit, wherein the switching circuit comprises: a first switch unit connecting, to an externally-connected a first electrostatic capacitance element, the power supply voltage provided from the battery; a second switch unit providing a electrostatic capacitance charged in a second electrostatic capacitance element to the bus; and a third switch unit charging the electrostatic capacitance in the first electrostatic capacitance element to the second electrostatic capacitance element and providing the power supply to the internal peripheral circuit.

Also, a summary of other invention of the present application will be briefly described.

The present invention comprises in which the first switch unit comprising a first Hi-side switch portion in which a one connecting part thereof is connected to the battery power supply side and the other connecting part thereof is connected to a one connecting part of the first electrostatic capacitance element and comprising a first Lo-side switch portion in which a one connecting part thereof is connected to the battery reference potential side and the other connecting part thereof is connected to the other connecting part of the first electrostatic capacitance element, the second switch unit comprising a second Hi-side switch portion in which a one connecting part thereof is connected to a one connecting part of the first electrostatic capacitance element and the other connecting part thereof is connected to one of the buses and comprising a second Lo-side switch portion in which a one connecting part thereof is connected to the other connecting part of the first electrostatic capacitance element and the other connecting part thereof is connected to the other of the buses, and the third switch unit comprising a third Hi-side switch portion in which a one connecting part thereof is connected to a one connecting part of the first electrostatic capacitance element and the other connecting part thereof is connected to a one connecting part of the second electrostatic capacitance element and comprising a third Lo-side switch portion in which a one connecting part thereof is connected to the other connecting part of the first electrostatic capacitance element and the other connecting part thereof is connected to the other connecting part of the second electrostatic capacitance element.

Also, the present invention comprises the first switch unit comprising the first Hi-side switch portion in which a one connecting part thereof is connected to the battery power supply side and the other connecting part thereof is connected to a one junction part of the first electrostatic capacitance element and comprising the first Lo-side switch portion in which a one connecting part thereof is connected to the battery reference potential side and the other connecting part thereof is connected to the other connecting part of the first electrostatic capacitance element, the third switch unit comprising the third Hi-side switch portion in which a one connecting part thereof is connected to a one connecting part of the first electrostatic capacitance element and the other connecting part thereof is connected to a one connecting part of the second electrostatic capacitance element and comprising the third Lo-side switch portion in which a one connecting part thereof is connected to the other connecting part of the first electrostatic capacitance element and the other connecting part thereof is connected to the other connecting part of the second electrostatic capacitance element, and the second switch unit comprising the second Hi-side switch portion in which a one connecting part thereof is connected to a one connecting part of the second electrostatic capacitance element and the other connecting part thereof is connected to one of the buses and comprising the second Lo-side switch portion in which a one connecting part thereof is connected to the other connecting part of the second electrostatic capacitance element and the other connecting part thereof is connected to the other of the buses.

Besides, the present invention comprises each of the first to third Hi-side switch portions comprising first and second transistors connected in series and comprising a P-channel MOS operating as a switch and comprising a first gate control unit generating a gate control signal from an inputted control signal and driving and controlling the first transistor by the gate control signal and comprising a second gate control unit outputting the gate control signal from an inputted control signal and driving and controlling the second transistor by the gate control signal and comprising a first power supply generating unit generating a power supply voltage by which the first gate control unit is operated and comprising a second power supply generating unit generating a power supply voltage by which the second gate control unit is operated, and each of the first to third Lo-side switch portions comprising third and fourth MOS transistors connected in series and operating as a switch and comprising a third gate control unit generating a gate control signal from an inputted control signal and driving and controlling the third transistor by the gate control signal and comprising a fourth gate control unit generating a gate control signal from an inputted control signal and driving and controlling the fourth transistor by the gate control signal and comprising a third power supply generating unit generating a power supply voltage by which the third gate control unit is operated and comprising a fourth power supply generating unit generating a power supply voltage by which the fourth gate control unit is operated.

Also, the present invention comprises the first to fourth gate control units comprising level shift units which level-shift the inputted control signals, to convert them to voltage levels for driving the first to fourth transistors, and output them and driver units which generate the gate control signals driving the first to fourth transistors from the signals outputted from the level shift units, and output them.

Moreover, the present invention comprises the driver units each has a configuration in which two inverters are connected in series.

Further, the present invention comprises in which the first to fourth power supply generating units are provided with Zener diodes connected between the power supply voltages provided from the battery, and the power supply voltages which generate, as references, Zener voltages of the Zener diodes are provided to the first to fourth gate control units.

Still further, the present invention comprises in which the first to fourth power supply generating units are provided with: first Zener diodes whose cathodes are connected to the power supply side of the battery; second Zener diodes whose cathodes are connected to anodes of the first Zener diodes and anodes are connected to the reference potential side of the battery; and switches connected between the anodes and the cathodes of the second Zener diodes; and the switches become non-conductive states in performing acceleration tests of gate breakdown voltages in the first to fourth transistors.

Effects of the Invention

Effects obtained by typical ones of the inventions disclosed in the present application will be briefly described below.

(1) The semiconductor integrated circuit device can be downsized.

(2) Reliability of the semiconductor integrated circuit device can be increased.

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

According to the present embodiment, a semiconductor integrated circuit device 1 is used for an airbag system of an automobile and is used as a communication device which controls a bus in the LAN protocol of Automotive Safety Restraints BUS (ASRB) 2.0.

Figure 1:
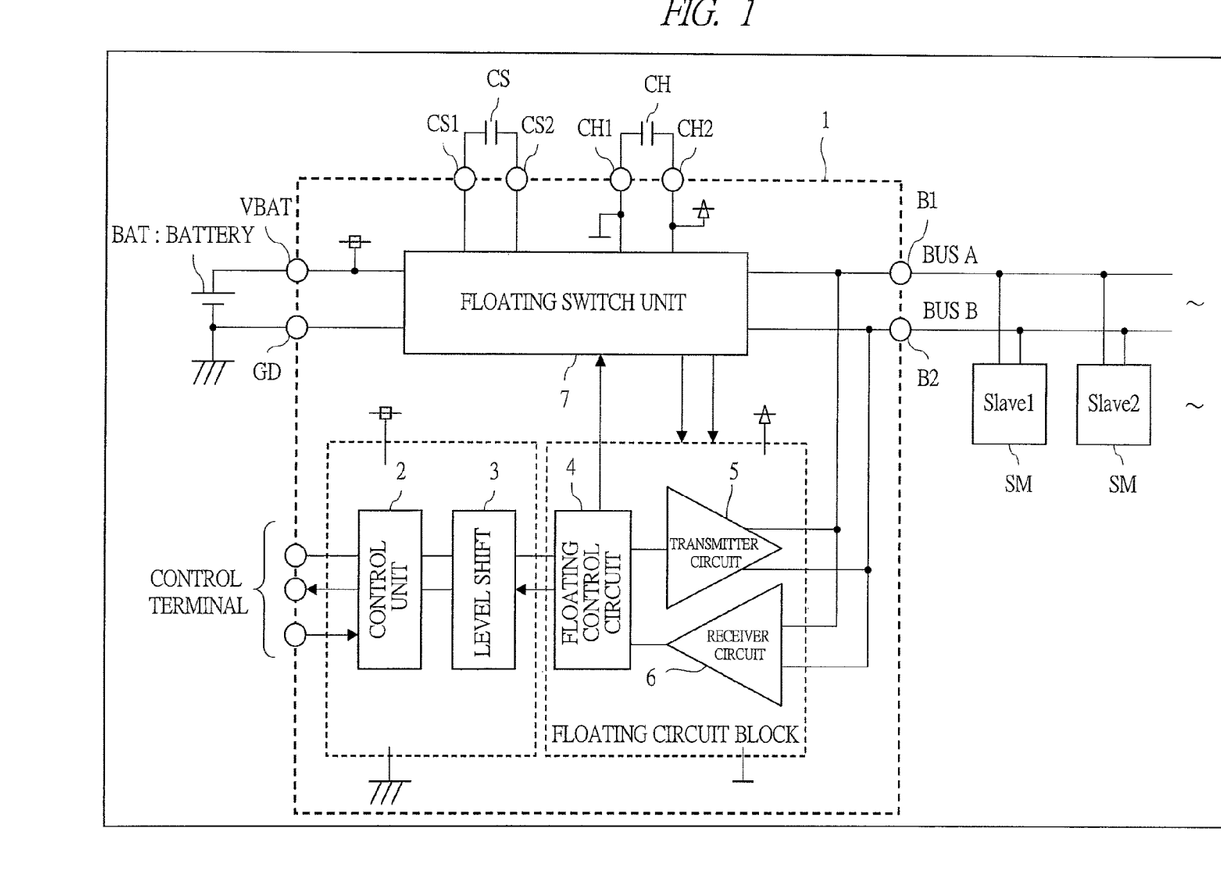
FIG. 1 is a block diagram showing a configuration example of a semiconductor integrated circuit device according to a first embodiment of the present invention.

As shown in FIG. 1, the semiconductor integrated circuit device 1 comprises a control unit 2, a level shift 3, a floating control circuit 4, a transmitter circuit 5, a receiver circuit 6, and a floating switch unit 7.

Two buses A and B are connected to the transmitter circuit 5, the receiver circuit 6, and the floating switch unit 7. A slave unit SU which controls a peripheral device such as an airbag and a seatbelt is connected to the buses A and B.

And, to the floating control circuit 4, the transmitter circuit 5, and the receiver circuit 6 which are an internal peripheral circuit, the floating power supply is connected so as to be provided from the floating switch unit 7.

An MCU (Micro Controller Unit) which controls the entire airbag system through a control terminal is connected to the control unit 2. And a power supply voltage provided from an automobile battery BAT or the like is connected to the control unit 2, the level shift 3, and the floating switch unit 7 so as to be provided. Electrostatic capacitance elements CS and CH are connected externally to the floating switch unit 7, respectively.

The control unit 2 performs all control of the semiconductor integrated circuit device 1. The level shift 3 is an interface which performs a level conversion of a signal transmitted and received between the floating control circuit 4 operated by the floating power supply and the control unit 2 operated by the power supply voltage provided from the automobile battery BAT or the like.

The floating control circuit 4 performs a switching control of the floating switch unit 7 and controls a transmission/reception signal inputted from and outputted to the buses A and B through the transmitter circuit 5 and the receiver circuit 6.

The transmitter circuit 5 controls the voltage between the buses A and B, and the receiver circuit 6 determines the voltage level between the buses A and B. The floating switch unit 7 charges the electrostatic capacitance elements CS and CH by power supply provided from the battery BAT, provides power supply to the buses A and B and at the same time provides power supply to the floating control circuit 4, the transmitter circuit 5, and the receiver circuit 6 which operate as the floating circuit.

Figure 2:
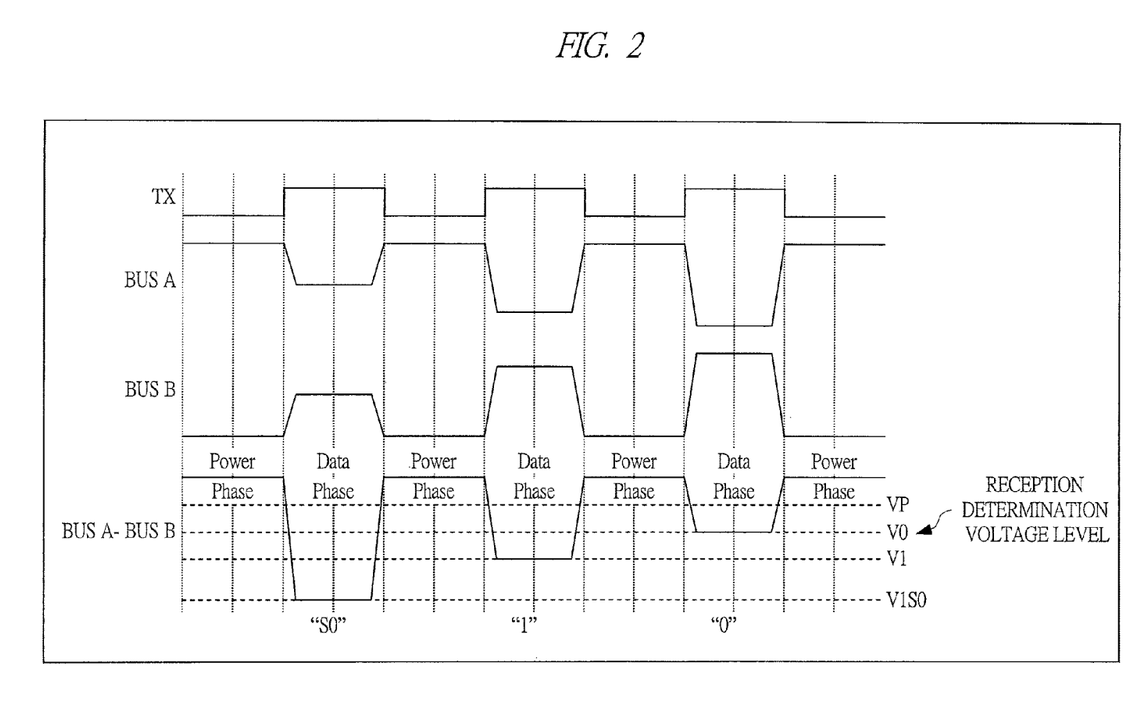
FIG. 2 is a timing chart showing a schematic operation of a bus in the semiconductor integrated circuit device of FIG. 1.
Figure 3:
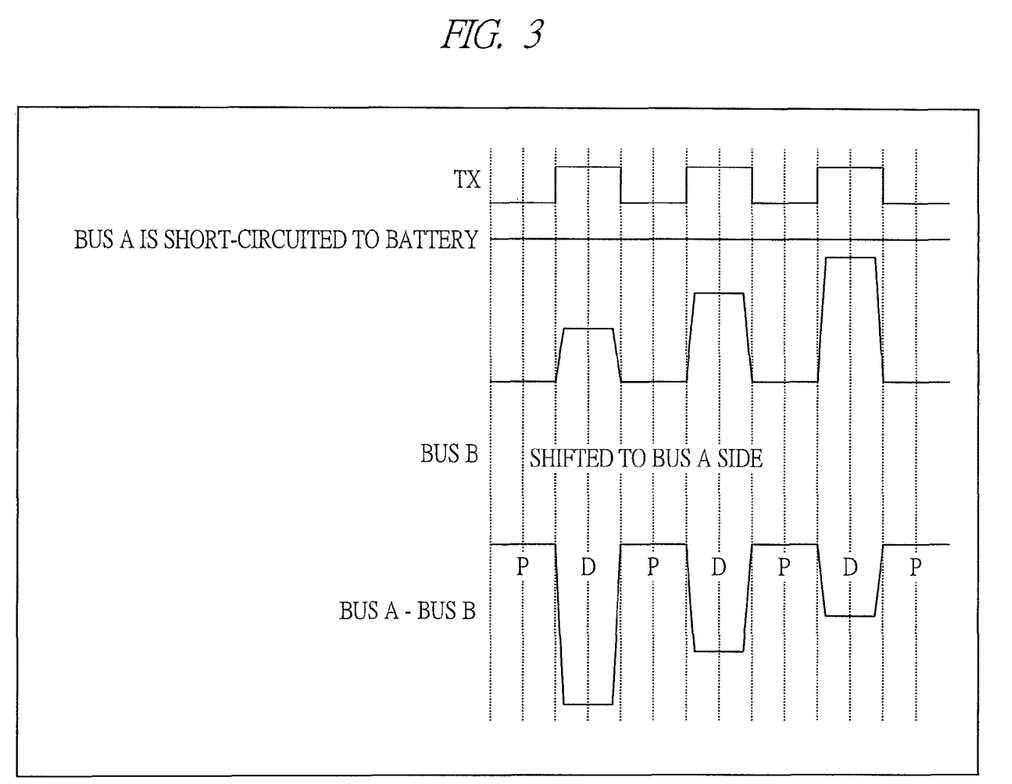
FIG. 3 is a timing chart showing a schematic operation of a case in which the bus in the semiconductor integrated circuit device of FIG. 1 is short-circuited to a battery.
Figure 4:
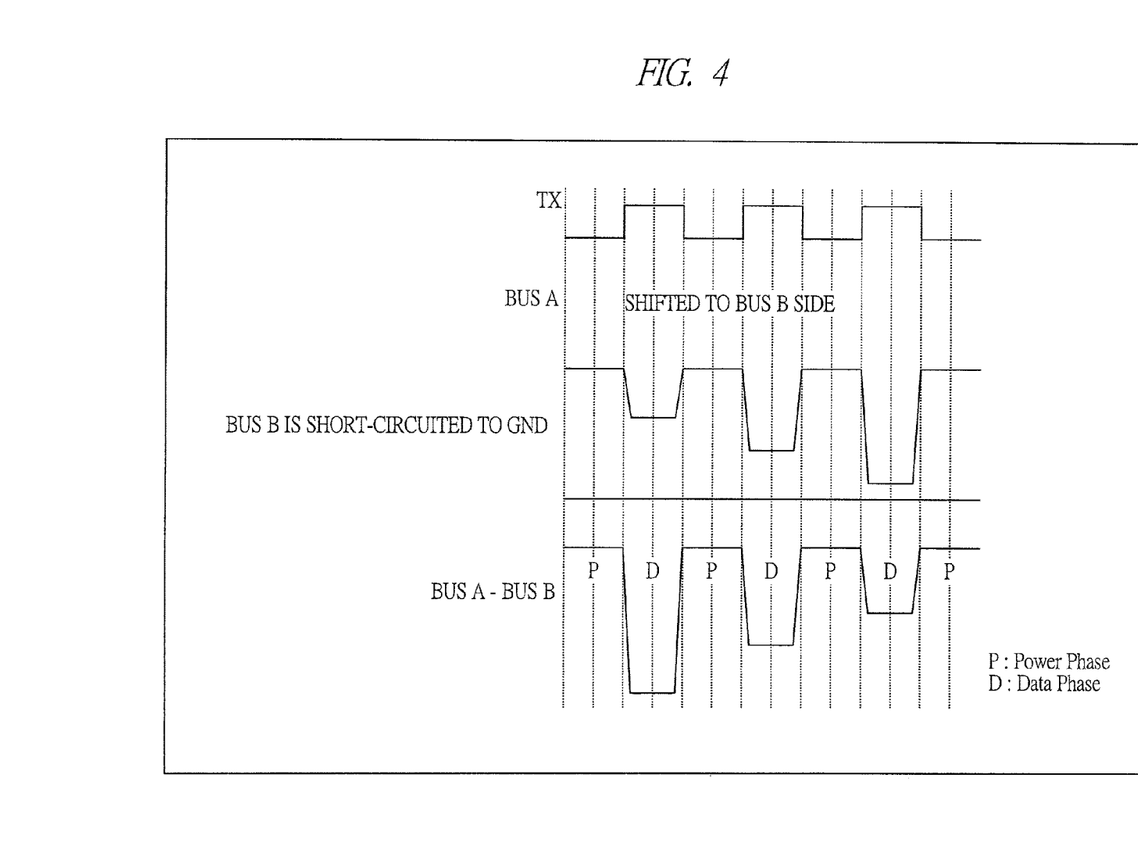
FIG. 4 is a timing chart showing a schematic operation of a case in which the bus in the semiconductor integrated circuit device of FIG. 1 is short-circuited to a ground potential.

Schematic operation outlines of the buses A and B will be described by using FIG. 2 to FIG. 4.

The plurality of slave units SU on a slave side are connected to the buses A and B as described above, and communication is established through the buses A and B. In operations of the buses, as shown in FIG. 2, a power phase (Tx=Lo) and a data phase (Tx=Hi) are alternately switched.

The power phase is used for providing power supply from the master to the slave, and the data phase is used for transmission/reception of data. In the transmission/reception of data, the data is determined by a voltage level difference between the buses A and B (bus A−bus B) of the two lines.

For example, when the voltage level difference is at a voltage VP or more, it is regarded as the power phase, and when being at a lower voltage level than that, it is regarded as the data phase. In the data phase, '0' is determined at a voltage V0, and '1' is determined at a voltage V1 which is lower than the voltage V0.

And, a level at a voltage V1S0 which is lower than the voltage V1 is a special level and is used, for example, for ordering ignition of an airbag and the like.

The bus interface part, which comprises the floating control unit 4, the transmitter circuit 5, the receiver circuit and the like, becomes a floating circuit so that communication can be continued even when either one of the buses A and B is short-circuited to the power supply side of the battery BAT or a ground potential GND serving as a reference potential. For example, when the bus A is short-circuited to the battery, as shown in FIG. 3, the voltage level of the bus B is shifted to the battery voltage side and as shown in FIG. 4, when the bus B is short-circuited to the ground potential GND, the voltage level of the bus A is shifted to the ground potential GND side, whereby the buses operate so that a voltage difference of the buses (BUS A−BUS B) is always maintained.

Figure 5:
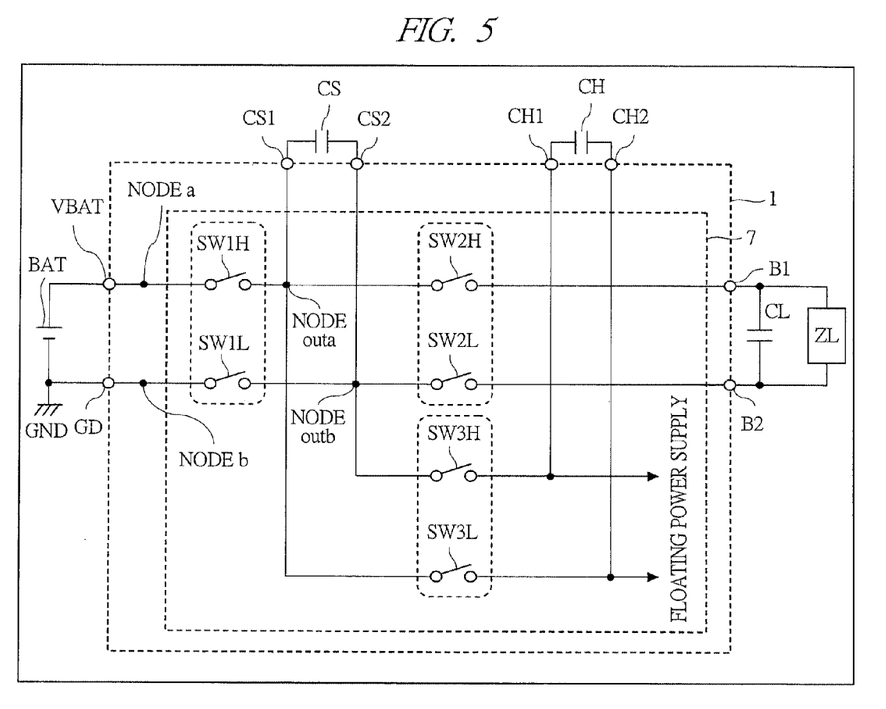
FIG. 5 is an explanatory diagram showing a configuration example of a floating switch unit provided in the semiconductor integrated circuit device of FIG. 1.

FIG. 5 is an explanatory diagram showing a configuration example of the floating switch unit 7. In FIG. 5, "CL" represents a bus load capacitance, and "ZL" represents a bus load impedance.

As shown in Figure, the floating switch unit 7 comprises: switch portions SW1H and SW1L configuring a first switch unit; switch portions SW2H and SW2L configuring a second switch unit; and switch portions SW3H and SW3L configuring a third switch unit.

The switch portion SW1H as a first Hi-side switch unit and the switch portion SW1L as a first Lo-side switch unit function as a switch for performing charges from the battery BAT to the electrostatic capacitance element CS.

The switch portion SW3H as a third Hi-side switch unit and the switch portion SW3L as a third Lo-side switch unit function as a switch for performing charges from the electrostatic capacitance element CS as a first electrostatic capacitance element to the electrostatic capacitance element CH as a second electrostatic capacitance element.

The switch portion SW2H as a second Hi-side switch unit and the switch portion SW2L as a second Lo-side switch unit function as a switch which connects the electrostatic capacitance element CS to each of the buses A and B.

A one connecting part of the switch portion SW1H is connected to a power supply terminal VBAT, and a one connecting part of the switch portion SW1L is connected to a ground potential terminal GD. And the battery BAT is connected externally through the power supply terminal VBAT and the ground potential terminal GD.

The other connecting part of the switch portion SW1H is connected to a one connecting part of the switch portion SW2H, SW3L and a capacitance terminal CS1, respectively. The other connecting part of the switch portion SW1L is connected to a one connecting part of the switch portion SW2L, SW3H and a capacitance terminal CS2, respectively. The electrostatic capacitance element CS is connected externally to the capacitance terminals CS1 and CS2.

A bus terminal B1 is connected to the other connecting part of the switch portion SW2H, and a bus terminal B2 is connected to the other connecting part of the switch portion SW2L, and the buses A and B are connected to the bus terminals B1 and B2, respectively.

The capacitance terminal CH1 is connected to the other connecting part of the switch portion SW3H, and the capacitance terminal CH2 is connected to the other connecting part of the switch portion SW3L. The electrostatic capacitance element CH is connected externally to the capacitance terminals CH1 and CH2.

Also, the other connecting parts of the switch portions SW3H and SW3L are connected respectively so that the power supply voltage is provided as a floating power supply to the floating control circuit 4, the transmitter circuit 5, and the receiver circuit 6.

Next, an operation of the floating switch unit 7 according to the present embodiment will be described.

First, during a normal operation, as described above, the power phase and the data phase are repeated. In a power phase period, the switch portions SW2H and SW2L and the switch portions SW3H and SW3L are turned ON (conductive state) respectively, and the switch portions SW1H and SW1L are turned OFF (non-conductive state), and the floating power supply is provided from the electrostatic capacitance element CS to each of the buses A and B, the floating control circuit 4, the transmitter circuit 5, and the receiver circuit 6.

In a data phase period, the switch portions SW1H and SW1L are turned ON, and the switch portions SW2H, SW2L, SW3H, and SW3L are turned OFF. Thereby, the electrostatic capacitance element CS is charged by the power supply of the battery BAT, and the electrostatic capacitance element CH provides the floating power supply to each of the floating control circuit 4, the transmitter circuit 5, and the receiver circuit 6.

And, when the power supply is turned on, since the electrostatic capacitance elements CH and CS are not charged, only providing the power supply is repeated until a voltage level is increased by a certain level. In this case, in a period corresponding to the data phase, only the switch portions SW1H and SW1L are turned ON, whereby the electrostatic capacitance element CS is charged from the power supply of the battery BAT, and the electrostatic capacitance element CH provides the power supply voltage to each of the floating control circuit 4, the transmitter circuit 5, and the receiver circuit 6.

In a period corresponding to the power phase, the switch portions SW3H and SW3L are turned ON, thereby performing charges from the electrostatic capacitance element CS to the electrostatic capacitance element CH and at the same time providing the power supply voltage to each of the floating control circuit 4, the transmitter circuit 5, and the receiver circuit 6. And, when the power supply is turned ON, since providing the power supply is not performed to the buses A and B, the switch portions SW2H and SW2L are turned OFF.

By this manner, the floating switch unit 7 in which the number of switch portions is significantly reduced can be configured. In the data phase period, since only the switch portions SW1H and SW1L are turned ON, ON-resistance of each of the switch portions can be increased, whereby the switch portions can be downsized.

Next, configuration examples of the switch portions SW1H and SW1L will be described by using FIG. 6 to FIG. 8.

Figure 6:
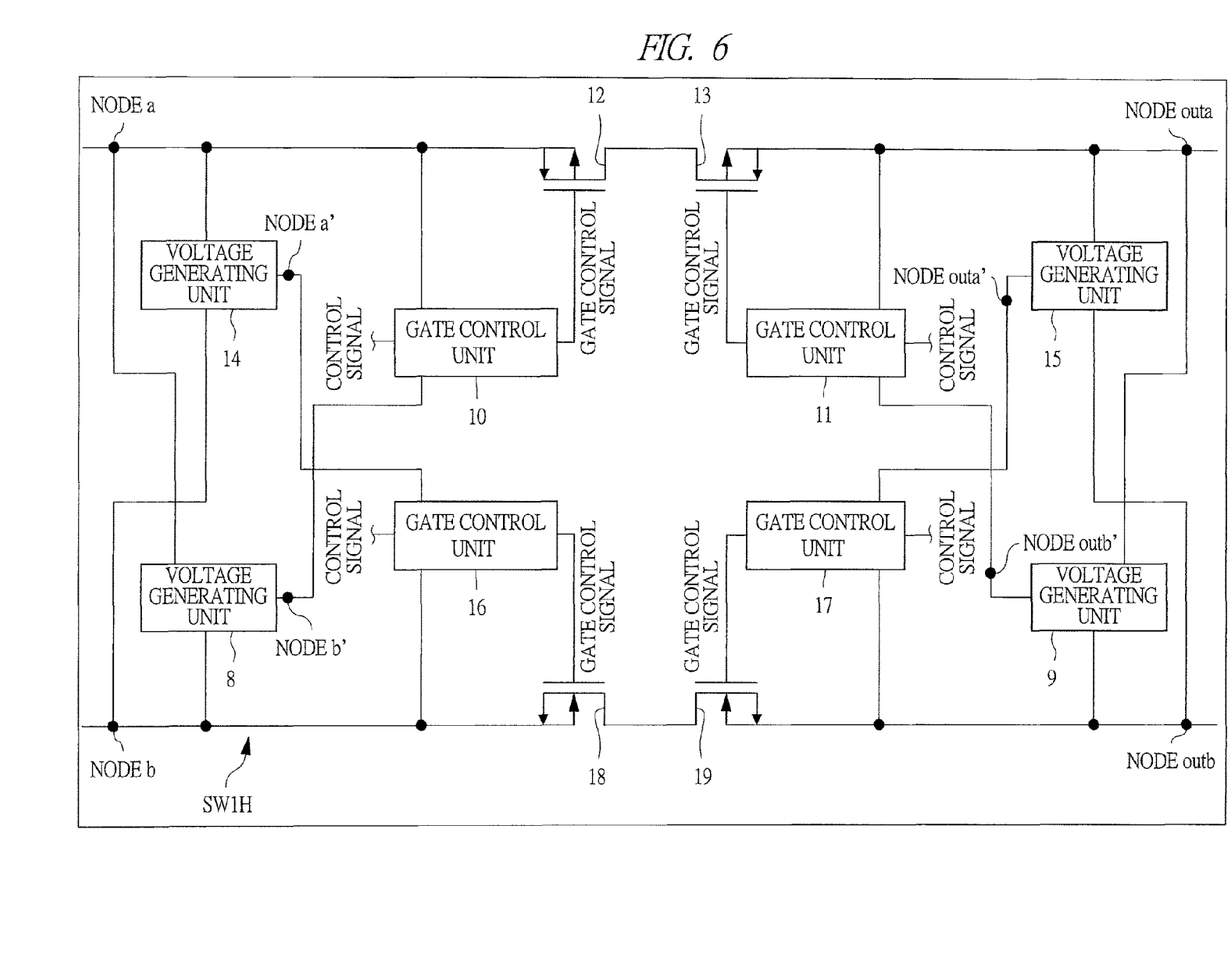
FIG. 6 is an explanatory diagram showing a configuration example of a switch unit provided in the semiconductor integrated circuit device of FIG. 1.

As shown in FIG. 6, the switch portion SW1H comprises: voltage generating units 8 and 9; gate control units 10 and 11; and transistors 12 and 13 which comprise P-channel MOSs and serve as first and second MOS transistors.

The switch portion SW1L comprises: voltage generating units 14 and 15; gate control units 16 and 17; and transistors 18 and 19 which comprise N-channel MOSs and serve as third and fourth MOS transistors.

The voltage generating units 8 and 9 generate operation voltages which are provided from the power supply voltage of the battery BAT to the gate control units 10 and 11, respectively. Here, output parts of the power supply provided from the voltage generating units 8 and 9 to the gate control units 10 and 11 are a NODE b' and a NODE outb', respectively.

The voltage generating units 14 and 15 generate the operating voltages which are provided from the power supply voltage of the battery BAT to the gate control units 16 and 17, respectively. Here, output parts of the power supply provided from the voltage generating units 14 and 15 to the gate control units 16 and 17 are a NODE a' and a NODE outa', respectively.

The gate control units 10 and 11 output, based on the control signal outputted from the floating control unit 4, the gate control signal, which drives the transistors 12 and 13, to the gate of the transistors 12 and 13, respectively. The transistors 12 and 13 are connected in series between the NODE a and the NODE outa shown in FIG. 5. The gate control units 16 and 17 output, based on the control signal outputted from the floating control unit 4, the gate control signal, which drives the transistors 18 and 19, to gates of the transistors 18 and 19, respectively. The transistors 18 and 19 are connected in series between the NODE b and the NODE outb shown in FIG. 5.

In FIG. 6, the configuration example of the switch portion SW1H and the switch portion SW1L has been shown. However, the configurations of the switch portion SW2H, SW3H, SW2L, and SW3L are also similar to configurations shown by FIG. 6.

Figure 7:
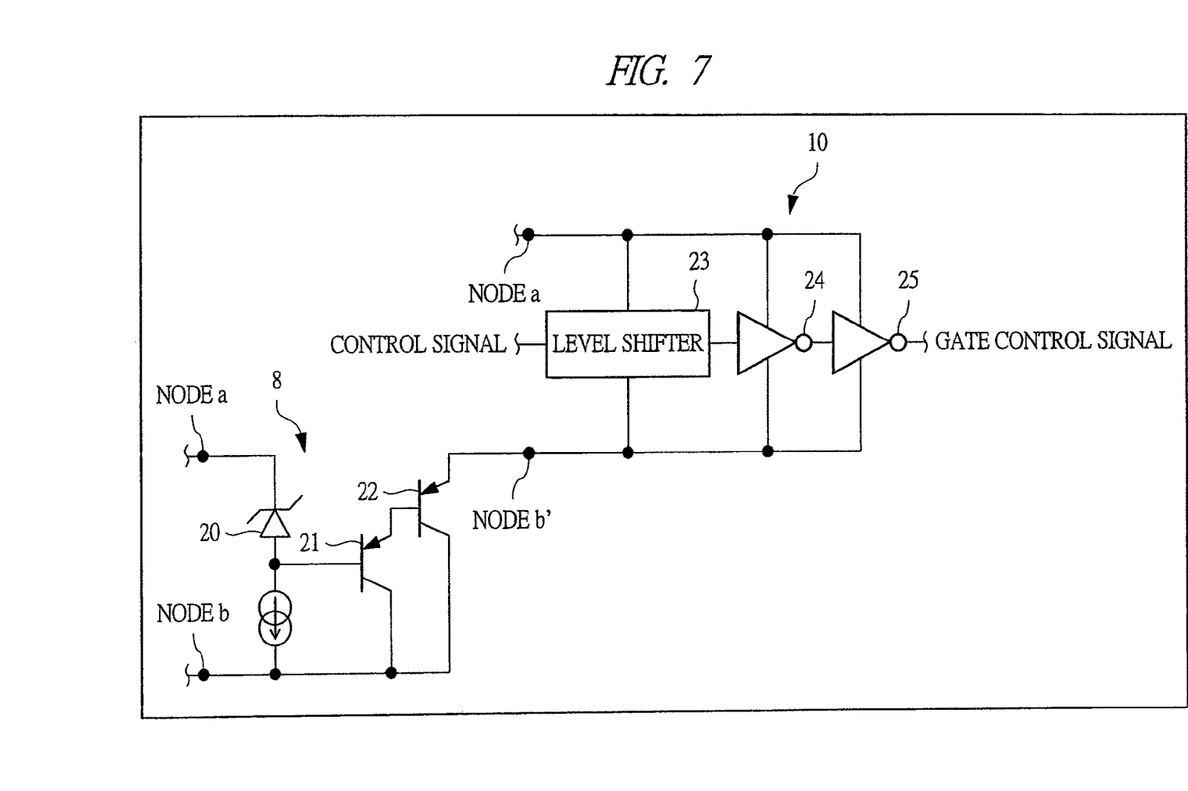
FIG. 7 is an explanatory diagram showing a configuration example of a voltage generating unit and a gate control unit provided in the switch unit of FIG. 6.

FIG. 7 is an explanatory diagram showing a configuration example of the voltage generating unit 8 and the gate control unit 10 in the switch portion SW1H.

As shown in Figure, the voltage generation unit 8 comprises a Zener diode 20 and P-type transistors 21 and 22 composed of bipolars, and the gate control unit 10 comprises a level shifter 23 and inverters 24 and 25.

A cathode of the Zener diode 20 is connected to the NODE a, and an anode of the Zener diode 20 is connected to the NODE b. The anode of the Zener diode 20 is connected to a base of the transistor 22.

And, a base of the transistor 22 is connected to an emitter of the transistor 21. Each collector of the transistors 21 and 22 is connected to the NODE b. An emitter of the transistor 22 is connected to the NODE b'.

To an input part of the level shifter 23, a control signal outputted from the floating control unit 4 is connected so as to be inputted. And to an output part of the level shifter 23, the inverters 24 and 25 are configured to be connected in series.

To power supply parts of the level shifter 23 and the inverters 24 and 25, the voltage level between the NODE a and the NODE b', that is, such a power supply voltage that a Zener voltage of the Zener diode 20 is generated as a reference is connected.

Therefore, the control signal outputted from the floating control unit 4 is converted in voltage level by the level shifter 23, and then, through the inverters 24 and 25, is outputted as a gate control signal which drives the transistor 12.

In this manner, by using the inverters 24 and 25 in driving the transistor 12, the transistor 12 can be driven at high speed. And, by using the inverters 24 and 25, power consumption can be reduced, whereby power consumption reduction of the semiconductor integrated circuit device 1 can be realized.

Figure 8:
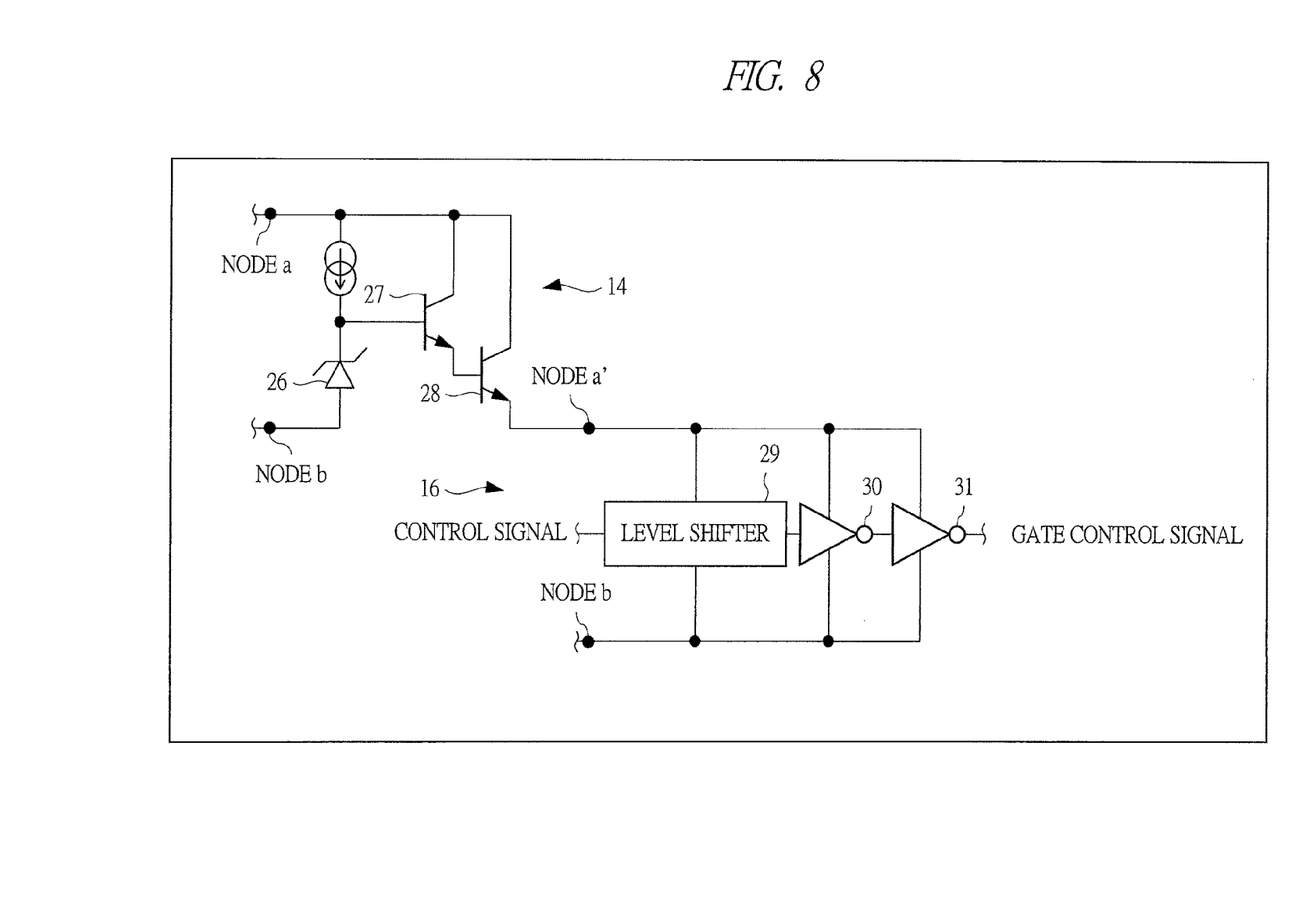
FIG. 8 is an explanatory diagram showing another configuration example of the voltage generating unit and the gate control unit provided in the switch unit of FIG. 6.

FIG. 8 is an explanatory diagram showing a configuration example of the voltage generating unit 14 and the gate control unit 16 in the switch portion SW1L.

As shown in the diagram, the voltage generating unit 14 comprises: a Zener diode 26; and N-type transistors 27 and 28 composed of bipolars. And the gate control unit 16 comprises a level shifter 29 and inverters 30 and 31.

A cathode of the Zener diode 26 is connected to the NODE a, and an anode of the Zener diode 26 is connected to the NODE b. A cathode of the Zener diode 26 is connected to a base of the transistor 27.

Each collector of the transistors 27 and 28 is connected to the NODE a, and the emitter of the transistor 27 is connected to a base of the transistor 28. And an emitter of the transistor 28 is connected to the NODE a'.

Also, to an input part of the level shifter 29, the control signal outputted from the floating control unit 4 is connected so as to be inputted. And to an output part of the level shifter 29, the inverters 30 and 31 are connected in series.

To power supply parts of the level shifter 29 and the inverters 30 and 31, the voltage level between the NODE a' and the NODE b, that is, such a power supply voltage that a Zener voltage of the Zener diode 26 is generated as a reference is connected.

Also in this case, the control signal output from the floating control unit 4 is converted the voltage level by the level shifter 29, and then, through the inverters 30 and 31, is output as a gate control signal which drives the transistor 18.

And, in FIG. 7 and FIG. 8, the configuration examples of the voltage generating units 8 and 14 and the gate control units 10 and 16 of the switch portion SW1H are described. However, the voltage generating units 9 and 15 and the gate control units 11 and 17 of the switch portion SW1H, and the voltage generating units and the gate control units provided in the switch portions SW1L, SW2H, SW3H, SW2L, and SW3L are also the similar configuration.

In this manner, by the configuration of driving the transistors 12, 13, 18, and 19 respectively using the inverters 24, 25, 30, and 31, the switching speed of the transistors 12, 13, 18, and 19 can be improved, whereby current consumption can be also reduced.

By this manner according to the first embodiment, the performance can be improved as downsizing the semiconductor integrated circuit device 1. Besides, the reliability of the semiconductor integrated circuit device 1 can be improved.

Also, for example, the voltage generating unit 14 can be configured enable to easily perform an acceleration test of a gate breakdown voltage in the MOS transistor which functions as a transistor for switching.

Figure 9:
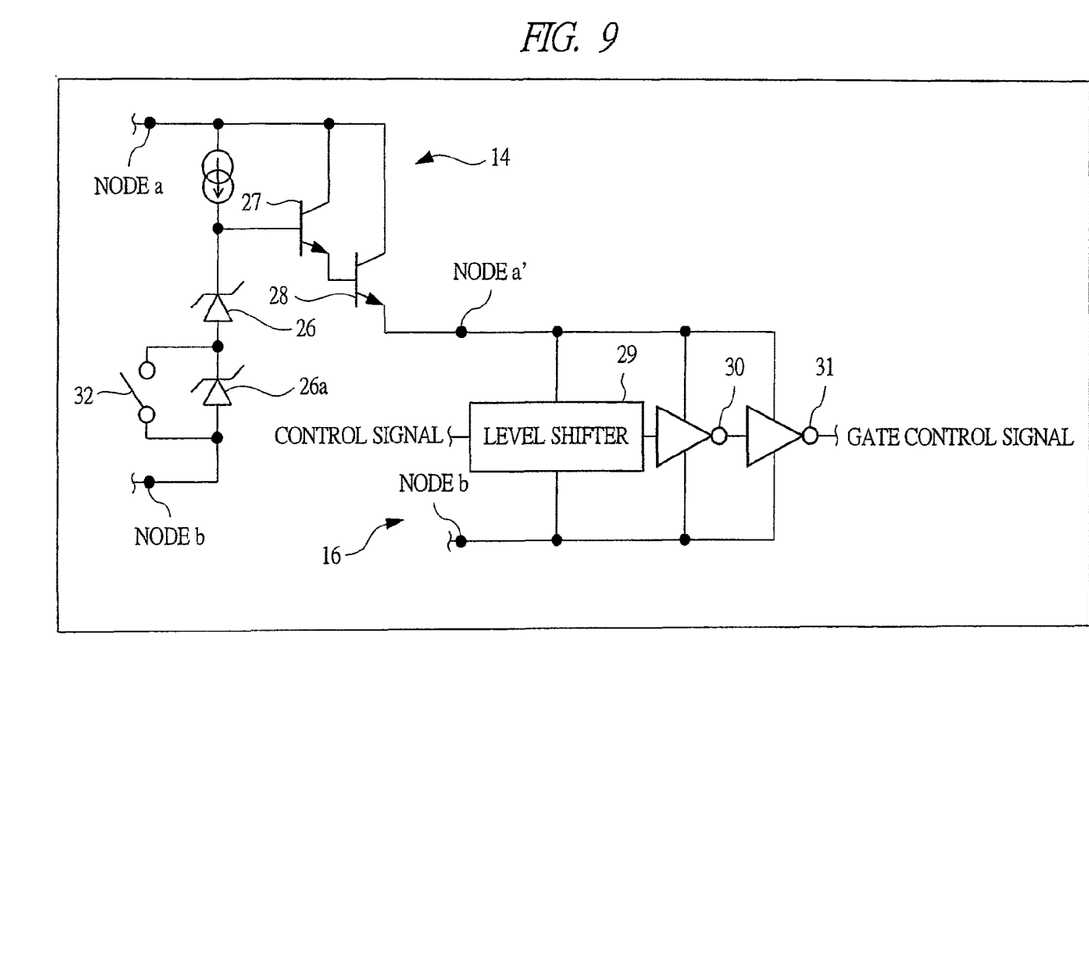
FIG. 9 is an explanatory diagram showing a configuration example of a voltage generating unit and a gate control unit provided in a switch unit according to another embodiment of the present invention.

In this case, as shown in FIG. 9, in the voltage generating unit 14, a Zener diode 26a which functions as a new first Zener diode is connected in series to a Zener diode 26 which functions as a first Zener diode, and a switch 32 is provided between the anode and the cathode of the Zener diode 26a.

Normally, the switch 32 is turned ON. By turning it OFF when performing an acceleration test of a gate breakdown voltage in the transistor 18, the voltage applied to the gate of the transistor 18 can be easily increased. Note that, herein, although the voltage generating unit 14 has been described, it is configured so that the similar circuit is added to all of the voltage generating units.

Second Embodiment

In a second embodiment, the semiconductor integrated circuit device 1 comprises, as same with the above-described first embodiment (FIG. 1), the control unit 2, the level shift 3, the floating control circuit 4, the transmitter circuit 5, the receiver circuit 6, and the floating switch unit 7.

Figure 10:
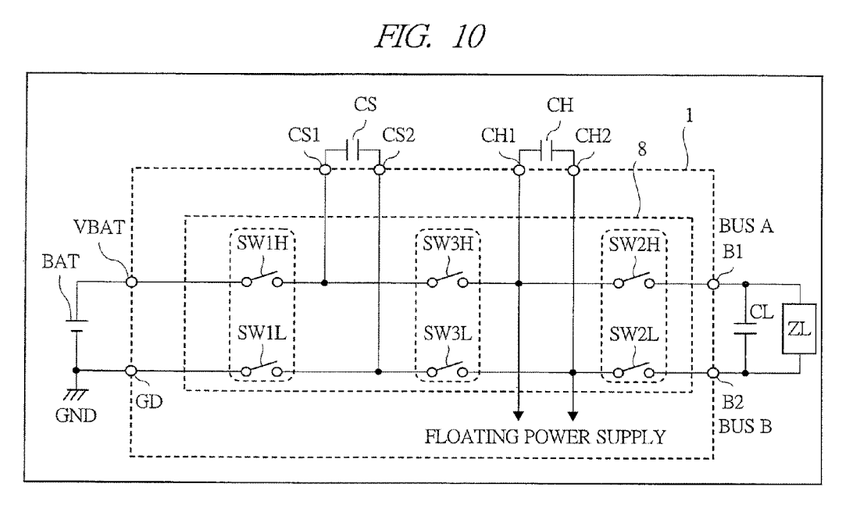
FIG. 10 is an explanatory diagram showing a configuration example of a floating switch unit according to a second embodiment of the present invention.

And, as shown in FIG. 10, the floating switch unit 7 comprises six switch portions SW1H, SW1L, SW2H, SW2L, SW3H, and SW3L, and the different point from FIG. 5 of the above-described embodiment is the relation of the connection of the switch portions SW2H and SW2L and the switch portions SW3H and SW3L.

In this case, the one connecting part of the switch portion SW3H is connected to the other connecting part of the switch SW1H, and the one connecting part of the switch portion SW3L is connected to the other connecting part of the switch SW1L.

Also, the one connecting part of the switch SW2H is connected to the other connecting part of the switch portion SW3H, and the one connecting part of the switch SW2L is connected to the other connecting part of the switch portion SW3L.

And, bus terminals B1 and B2 are connected to the other connecting parts of the switches SW2H and SW2L, respectively.

Also the other connecting parts of the switch portions SW3H and SW3L are connected so that the power supply voltage is provided to the floating control circuit 4, the transmitter circuit 5, and the receiver circuit 6, respectively as the floating power supply.

The capacitance terminals CS1 and CS2 are connected to the other connecting parts of the switch portions SW1H and SW1L, respectively. And the capacitance terminals CH1 and CH2 are connected to the other connecting parts of the switch portions SW3H and SW3L, respectively. The electrostatic capacitance element CS is connected externally to the capacitance terminals CS1 and CS2, and the electrostatic capacitance element CH is connected externally to the capacitance terminals CH1 and CH2.

In the floating switch unit 7 according to the second embodiment, in the power phase period when in normal operation, the switch portions SW1H and SW1L are turned OFF, and the switch portions SW2H, SW3H, SW2L, and SW3L are turned ON, respectively. Through the switch portions SW2H, SW3H, SW2L and SW3L, the floating power supply is provided from the electrostatic capacitance element CS to the buses A and B, the floating control circuit 4, the transmitter circuit 5, and the receiver circuit 6.

Also, about the other operations, the explanation thereof is omitted since they are similar to those of the above-described first embodiment.

Therefore, also in this case, the floating switch unit 7 in which the number of the switch portions is considerably reduced can be configured. Also, in the data phase period, since only the switch portions SW1H and SW1L are required to be turned ON, the ON-resistance of each of the switch portions can be increased, whereby the switch units can be downsized.

By this manner, also in the second embodiment, the performance can be improved as downsizing the semiconductor integrated circuit device 1. Also, the reliability of the semiconductor integrated circuit device 1 can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The present invention is, in a semiconductor integrated circuit device, appropriate for the technique that considerably reduces the number of switches in a switching circuit which provides a floating power supply.

The invention claimed is:

1. An airbag control unit having a semiconductor device, a battery, a first electrostatic capacitance element, a second electrostatic capacitance element and two buses, wherein
the semiconductor device comprises:
an internal peripheral circuit and
a switching circuit, wherein
the switching circuit comprises:
a first switch unit providing a power supply voltage provided from the battery to the first electrostatic capacitance element;
a second switch unit providing an electrostatic capacitance charged in the second electrostatic capacitance element to the buses; and
a third switch unit charging an electrostatic capacitance of the first electrostatic capacitance element to the second electrostatic capacitance element and providing power supply to the internal peripheral circuit.

2. The airbag control unit according to claim 1, wherein
the first switch unit comprises:
a first Hi-side switch portion in which one connecting part thereof is connected to a power supply side of the battery and another connecting part thereof is connected to one connecting part of the first electrostatic capacitance element; and
a first Lo-side switch portion in which one connecting part thereof is connected to a reference potential side of the battery and another connecting part thereof is connected to another connecting part of the first electrostatic capacitance element,
the second switch unit comprises:
a second Hi-side switch portion in which one connecting part thereof is connected to the one connecting part of the first electrostatic capacitance element and another connecting part thereof is connected to one of the buses; and
a second Lo-side switch portion in which one connecting part thereof is connected to the other connecting part of the first electrostatic capacitance element and another connecting part thereof is connected to the other of the buses, and
the third switch unit comprises:
a third Hi-side switch portion in which one connecting part thereof is connected to the other connecting part of the first electrostatic capacitance element and another connecting part thereof is connected to one connecting part of the second electrostatic capacitance element; and
a third Lo-side switch portion in which one connecting part thereof is connected to the one connecting part of the first electrostatic capacitance element and another connecting part thereof is connected to another connecting part of the second electrostatic capacitance element.

3. The airbag control unit according to claim 2, wherein
each of the first to third Hi-side switch portions comprises:
first and second MOS transistors which are connected in series and operated as a switch;
a first gate control unit which generates a gate control signal from an inputted control signal and drives and controls the first MOS transistor by the gate control signal;
a second gate control unit which outputs a gate control signal from an inputted control signal and drives and controls the second MOS transistor by the gate control signal;
a first power supply generating unit which generates a power supply voltage by which the first gate control unit is operated; and
a second power supply generating unit which generates a power supply voltage by which the second gate control unit is operated, and
each of the first to third Lo-side switch portions comprises:
third and fourth MOS transistors which are connected in series and operated as a switch;
a third gate control unit which generates a gate control signal from an inputted control signal and drives and controls the third MOS transistor by the gate control signal;
a fourth gate control unit which generates a gate control signal from an inputted control signal and drives and controls the fourth transistor by the gate control signal;
a third power supply generating unit which generates a power supply voltage by which the third gate control unit is operated; and
a fourth power supply generating unit which generates a power supply voltage by which the fourth gate control unit is operated.

4. The airbag control unit according to claim 3, wherein
the first to fourth gate control units comprise:
level shift units which level-shift the inputted control signals, to convert them to voltage levels for driving the first to fourth MOS transistors, and output them; and
driver units which generate the gate control signals driving the first to fourth MOS transistors from the signals outputted from the level shift units, and output them.

5. The airbag control unit according to claim 4, wherein
the driver units each have a configuration in which two inverters are connected in series.

6. The airbag control unit according to claim 5, wherein
the first to fourth power supply generating units comprise
Zener diodes connected between the power supply voltages provided from the battery, and
power supply voltages which generate, as references, Zener voltages of the Zener diodes are provided to the first to fourth gate control units.

7. The airbag control unit according to claim 3, wherein
the first to fourth power supply generating units comprise
Zener diodes connected between the power supply voltages provided from the battery, and
power supply voltages which generate, as references, Zener voltages of the Zener diodes are provided to the first to fourth gate control units.

8. The airbag control unit according to claim 3, wherein
the first to fourth power supply generating units comprise:
first Zener diodes whose cathodes are connected to the power supply side of the battery;
second Zener diodes whose cathodes are connected to anodes of the first Zener diodes and whose anodes are connected to the reference potential side of the battery; and
switches connected between the anodes and the cathodes of the second Zener diodes, and
the switches become non-conductive states in performing acceleration tests of gate breakdown voltages in the first to fourth MOS transistors.

9. The airbag control unit according to claim 4, wherein
the first to fourth power supply generating units comprise
Zener diodes connected between the power supply voltages provided from the battery, and
power supply voltages which generate, as references, Zener voltages of the Zener diodes are provided to the first to fourth gate control units.

10. The airbag control unit according to claim 4, wherein
the first to fourth power supply generating units comprise:
first Zener diodes whose cathodes are connected to the power supply side of the battery;
second Zener diodes whose cathodes are connected to anodes of the first Zener diodes and whose anodes are connected to the reference potential side of the battery; and
switches connected between the anodes and the cathodes of the second Zener diodes, and
the switches become non-conductive states in performing acceleration tests of gate breakdown voltages in the first to fourth MOS transistors.

11. The airbag control unit according to claim 5, wherein
the first to fourth power supply generating units comprise:
first Zener diodes whose cathodes are connected to the power supply side of the battery;
second Zener diodes whose cathodes are connected to anodes of the first Zener diodes and whose anodes are connected to the reference potential side of the battery; and
switches connected between the anodes and the cathodes of the second Zener diodes, and
the switches become non-conductive states in performing acceleration tests of gate breakdown voltages in the first to fourth MOS transistors.

12. The airbag control unit according to claim 1, wherein
the first switch unit comprises:
a first Hi-side switch portion in which one connecting part thereof is connected to a power supply side of the battery and another connecting part thereof is connected to one connecting part of the first electrostatic capacitance element; and
a first Lo-side switch portion in which one connecting part thereof is connected to a reference potential side of the battery and another connecting part thereof is connected to another connecting part of the first electrostatic capacitance element,
the third switch unit comprises:
a third Hi-side switch portion in which one connecting part thereof is connected to the one connecting part of the first electrostatic capacitance element and another connecting part thereof is connected to one connecting part of the second electrostatic capacitance element; and
a third Lo-side switch portion in which one connecting part thereof is connected to the other connecting part of the first electrostatic capacitance element and another connecting part thereof is connected to another connecting part of the second electrostatic capacitance element, and
the second switch part comprises:
a second Hi-side switch portion in which one connecting part thereof is connected to the one connecting part of the second electrostatic capacitance element and another connecting part thereof is connected to one of the buses; and
a second Lo-side switch portion in which one connecting part thereof is connected to the other connecting part of the second electrostatic capacitance element and another connecting part thereof is connected to the other of the buses.

13. The airbag control unit according to claim 12, wherein
each of the first to third Hi-side switch portions comprises:
first and second MOS transistors which are connected in series and operated as a switch;
a first gate control unit which generates a gate control signal from an inputted control signal and drives and controls the first MOS transistor by the gate control signal;
a second gate control unit which outputs a gate control signal from an inputted control signal and drives and controls the second MOS transistor by the gate control signal;
a first power supply generating unit which generates a power supply voltage by which the first gate control unit is operated; and
a second power supply generating unit which generates a power supply voltage by which the second gate control unit is operated, and
each of the first to third Lo-side switch portions comprises:
third and fourth MOS transistors which are connected in series and operated as a switch;
a third gate control unit which generates a gate control signal from an inputted control signal and drives and controls the third MOS transistor by the gate control signal;
a fourth gate control unit which generates a gate control signal from an inputted control signal and drives and controls the fourth transistor by the gate control signal;
a third power supply generating unit which generates a power supply voltage by which the third gate control unit is operated; and
a fourth power supply generating unit which generates a power supply voltage by which the fourth gate control unit is operated.

14. The airbag control unit according to claim 13, wherein
the first to fourth gate control units comprise:
level shift units which level-shift the inputted control signals, to convert them to voltage levels for driving the first to fourth MOS transistors, and output them; and
driver units which generate the gate control signals driving the first to fourth MOS transistors from the signals outputted from the level shift units, and output them.

15. The airbag control unit according to claim 14, wherein
the driver units each have a configuration in which two inverters are connected in series.

16. The airbag control unit according to claim 15, wherein
the first to fourth power supply generating units comprise
Zener diodes connected between the power supply voltages provided from the battery, and
power supply voltages which generate, as references, Zener voltages of the Zener diodes are provided to the first to fourth gate control units.

17. The airbag control unit according to claim 13, wherein
the first to fourth power supply generating units comprise
Zener diodes connected between the power supply voltages provided from the battery, and
power supply voltages which generate, as references, Zener voltages of the Zener diodes are provided to the first to fourth gate control units.

18. The airbag control unit according to claim 13, wherein the first to fourth power supply generating units comprise:
   first Zener diodes whose cathodes are connected to the power supply side of the battery;
   second Zener diodes whose cathodes are connected to anodes of the first Zener diodes and whose anodes are connected to the reference potential side of the battery; and
   switches connected between the anodes and the cathodes of the second Zener diodes, and
the switches become non-conductive states in performing acceleration tests of gate breakdown voltages in the first to fourth MOS transistors.

19. The airbag control unit according to claim 14, wherein the first to fourth power supply generating units comprise
   Zener diodes connected between the power supply voltages provided from the battery, and
   power supply voltages which generate, as references, Zener voltages of the Zener diodes are provided to the first to fourth gate control units.

20. The airbag control unit according to claim 14, wherein the first to fourth power supply generating units comprise:
   first Zener diodes whose cathodes are connected to the power supply side of the battery;
   second Zener diodes whose cathodes are connected to anodes of the first Zener diodes and whose anodes are connected to the reference potential side of the battery; and
   switches connected between the anodes and the cathodes of the second Zener diodes, and
the switches become non-conductive states in performing acceleration tests of gate breakdown voltages in the first to fourth MOS transistors.

21. The airbag control unit according to claim 15, wherein the first to fourth power supply generating units comprise:
   first Zener diodes whose cathodes are connected to the power supply side of the battery;
   second Zener diodes whose cathodes are connected to anodes of the first Zener diodes and whose anodes are connected to the reference potential side of the battery; and
   switches connected between the anodes and the cathodes of the second Zener diodes, and
the switches become non-conductive states in performing acceleration tests of gate breakdown voltages in the first to fourth MOS transistors.

* * * * *